(12) United States Patent
Sheen

(10) Patent No.: US 6,404,369 B1
(45) Date of Patent: Jun. 11, 2002

(54) DIGITAL TO ANALOG CONVERTER EMPLOYING SIGMA-DELTA LOOP AND FEEDBACK DAC MODEL

(75) Inventor: Timothy W. Sheen, Brighton, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/676,064

(22) Filed: Sep. 29, 2000

(51) Int. Cl.[7] .............................. H03M 1/12; H03M 3/00
(52) U.S. Cl. ........................................ 341/143; 341/156
(58) Field of Search .................................. 341/143, 118, 341/120, 144, 156

(56) References Cited

U.S. PATENT DOCUMENTS

| | | | | |
|---|---|---|---|---|
| 4,996,530 A | * | 2/1991 | Hilton | 341/120 |
| 5,027,119 A | * | 6/1991 | Toyomaki | 341/144 |
| 6,271,781 B1 | * | 8/2001 | Pellon | 341/143 |
| 6,271,782 B1 | * | 8/2001 | Steensgaard-Madsen | 341/143 |

* cited by examiner

Primary Examiner—Patrick Wamsley
(74) Attorney, Agent, or Firm—Bruce D. Rubenstein

(57) ABSTRACT

A circuit topology and method for converting a digital input signal to an analog output signal employs a modified sigma-delta loop and a DAC, and operates with improved accuracy over a wide frequency range. A loop filter such as a digital accumulator receives an input signal proportional to the difference between a digital input signal and a feedback signal. A quantizer quantizes the output of the loop filter, and the DAC converts the quantized signal into an analog output signal. The quantized signal is also provided to a DAC model. In response to the quantized signal and behavioral information about the DAC, the DAC model varies the feedback signal to match expected output signals from the DAC, including errors introduced by the DAC. By the operation of the sigma-delta loop, the errors of the DAC are substantially reduced.

26 Claims, 3 Drawing Sheets

DIGITAL TO ANALOG CONVERTER EMPLOYING SIGMA-DELTA LOOP AND FEEDBACK DAC MODEL

This invention relates generally to converting digital input signals to analog output signals. More particularly, this invention relates to enhancing the performance of a commercial digital-to-analog converter using a sigma-delta loop and other digital signal processing techniques, for use in automatic test equipment.

BACKGROUND OF THE INVENTION

A need commonly arises in automatic test equipment (ATE) to stimulate a device under test (DUT) with analog waveforms. In the conventional ATE paradigm, a test program prescribes analog waveforms to be applied to a DUT. A test system applies the waveforms, and monitors signals generated by the DUT in response to the waveforms. The test program passes or fails based upon whether the monitored signals from the DUT match expected, correct responses to a sufficient level of accuracy.

General-purpose ATE systems are preferably equipped for testing diverse types of devices that cover a wide range of frequencies. Conventional digital-to-analog converters (DACs) generally provide high accuracy over only limited frequency ranges, however. DACs that are accurate at high frequencies tend to be inaccurate at low frequencies, and DACs that are accurate at low frequencies tend to be inaccurate at high frequencies. These limitations have induced ATE developers to provide different circuit topologies for generating analog waveforms covering different frequency ranges. For example, an ATE system might employ one circuit topology for generating low frequency signals, and another circuit topology for generating higher frequency signals.

Developers have attempted to overcome these limitations in DAC performance by using simple, high-speed, low-resolution DACs driven by sigma-delta loops. FIG. 1 shows an example of a DAC topology 100 employing a sigma-delta loop. As shown in FIG. 1, a DAC 116 is configured to generate an analog output signal from an 8-bit digital input signal. The DAC 116 is sampled at a fast enough rate to generate an output signal with sufficient fidelity (i.e., at least the Nyquist rate), and a low-pass filter 124 smoothes the output of the DAC 116 to reduce artifacts of sampling.

Despite the fact that the DAC has only 8 bits of resolution, the effective resolution of the circuit 100 far exceeds 8-bits, owing to the operation of the sigma-delta loop. Within the sigma-delta loop, a digital input signal, "Digital In", having relatively high numeric resolution (e.g., 25 bits), is provided to an input of a summer 110. The summer 110 subtracts a feedback signal from the digital input signal to produce an error signal $E_S$. The error signal is then fed to a loop filter 112. The loop filter helps to stabilize the sigma-delta feedback loop and generally integrates the error signal over time (e.g., it accumulates $E_S$ over different samples). A quantizer 114 then renders the output of the loop filter 112 as an 8-bit signal by simple truncation. At any instant in time, the error signal represents the difference between the digital input signal and the quantized signal being input to the DAC 116. By operation of feedback, the sigma-delta loop tends to drive the error signal to zero, causing the 8-bit input to the DAC to precisely match—over time—the high resolution digital input signal. As a result, the output signal from the DAC 116 replicates the digital input signal, to an effective level of resolution much higher than the resolution of the DAC 116.

Because the DAC 116 inherently has low resolution, it can be constructed simply to operate with relatively high accuracy over a wide range of frequencies. Because it is combined with a sigma-delta loop, it can also achieve high effective resolution.

Despite these advantages, we have recognized that the DAC itself is still subject to errors that exceed the levels that are desired for automatic test equipment. These errors include, for example, DC errors, non-linearities, and transient errors. Although the sigma-delta loop greatly enhances the effective resolution of the DAC, it does necessarily improve the DAC's accuracy. Consequently, multiple DAC topologies are still required, each optimized for its own particular frequency range.

What is needed is a single topology for generating an analog output signal from a digital input signal, which can cover a broad range of frequencies with both high effective resolution and high accuracy.

SUMMARY OF THE INVENTION

With the foregoing background in mind, it is an object of the invention to generate accurate analog output signals from digital input signals, over a wide range of frequencies using a single circuit topology.

To achieve the foregoing object and other objectives and advantages, a circuit for converting a digital input signal to an analog output signal includes a DAC and a sigma-delta loop having a DAC model in its feedback loop. The sigma-delta loop compares a high resolution digital input signal with a feedback signal to generate an error signal, and a loop filter processes the error signal. The output of the loop filter is quantized, and the quantized signal is fed to the DAC. The quantized signal is also fed to the DAC model, which processes the quantized signal and produces the feedback signal. In response to stored behavioral information about the DAC, the DAC model adjusts the feedback signal to match expected values of the DAC in response to the quantized signal. The DAC model thus effectively emulates the DAC, including expected errors introduced by the DAC. Through the operation of feedback, the expected errors are substantially reduced and accuracy is improved.

BRIEF DESCRIPTION OF THE DRAWINGS

Additional objects, advantages, and novel features of the invention will become apparent from a consideration of the ensuing description and drawings, in which.

DESCRIPTION OF THE PREFERRED EMBODIMENT

Overview

Figure 1:
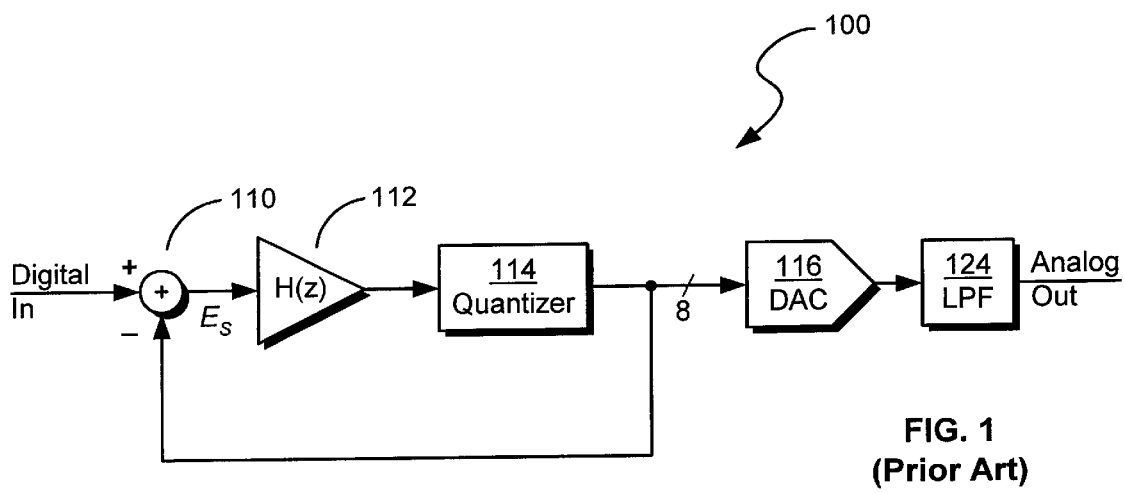
FIG. 1 is a simplified block diagram of a prior art circuit for converting a digital input signal to an analog output signal using a sigma-delta loop.
Figure 2:
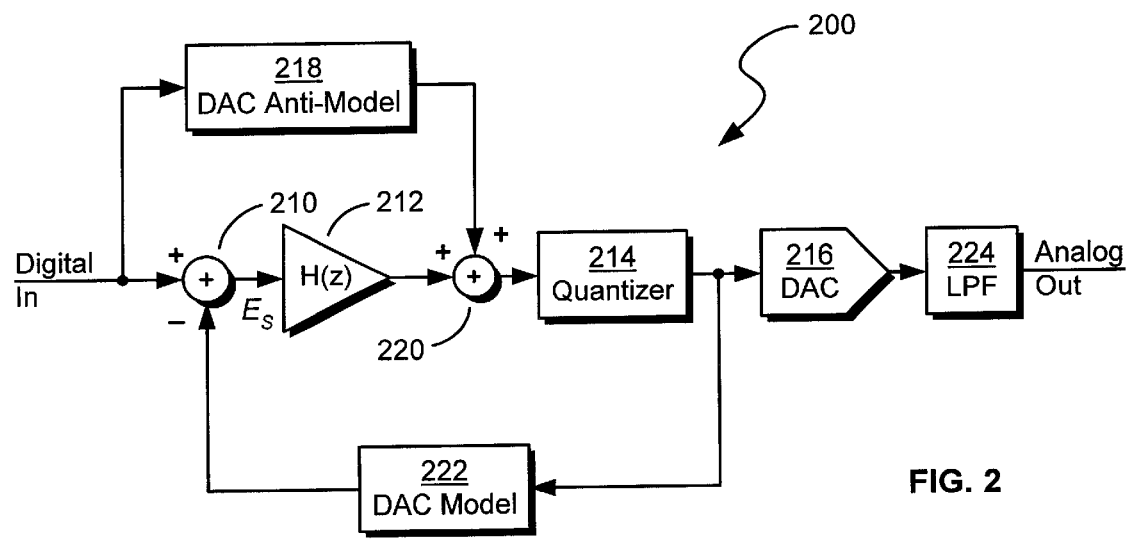
FIG. 2 is a simplified block diagram of a circuit for converting a digital input signal to an analog output signal in accordance with the invention.

FIG. 2 illustrates a topology 200 for generating an analog output signal from a digital input signal according to the invention. The topology of FIG. 2 is similar to the topology of FIG. 1 in many respects. For example, a digital input signal "Digital In" is provided to the input of a summer 210. The summer 210 generates an error signal that equals the difference between the digital input signal and a feedback signal. The error signal is fed to the input of a loop filter 212, and the output of the loop filter 212 is coupled to the input of a quantizer 214. A DAC 216 converts the quantized signal to an analog signal, and a low-pass filter 224 smoothes the output of the DAC 216 to reduce artifacts of sampling. The summer 210, loop filter 212, quantizer 214, DAC 216, and filter 224 of FIG. 2 are thus functionally similar to the corresponding elements 110, 112, 114, 116, and 124 of FIG. 1.

In other respects, the topology of FIG. 2 differs from that of FIG. 1. For example, FIG. 2 includes a DAC model 222, an anti-DAC model 218, and a summer 220, which are absent from FIG. 1. The DAC model 222 is coupled to the output of the quantizer 214 and provides the feedback signal to the summer 210. The anti-DAC model receives the digital input signal and generates an output signal that adds to the output of the loop filter, via the additional summer 220. These differences from the conventional sigma-delta DAC topology provide significant benefits, as will be described in more detail below.

We have recognized that inaccuracies in DAC circuits employing sigma-delta loops generally derive from inaccuracies in the DACs themselves. Returning to the conventional topology of FIG. 1, the quantizer 114 generates a near perfect representation of the digital input signal—as perfect as the sigma-delta loop's feedback can make it. We have found that errors principally derive from the fact that the DAC 116 generates an imperfect analog representation of the quantized signal.

The reason that the circuit 100 as a whole lacks accuracy, however, is not merely that the DAC is inaccurate. A more fundamental reason, we have found, is that the analog signal from the DAC 116 does not perfectly match the feedback signal from the quantizer. We have surmised that if the analog output signal and the feedback signal were somehow to be matched, then the errors from the DAC 116 would become irrelevant, as the sigma-delta loop would tend to drive the DAC to the correct output. With this in mind, we have concluded that the errors of the circuit 100 can be reduced not only by making the DAC match the feedback signal (i.e., by making the DAC perfect), but also by making the feedback signal match the DAC.

To this end, the DAC model 222 of FIG. 2 has been introduced with the intention of adjusting the feedback signal to precisely match the output of the DAC 216. The DAC model 222 has the same input as the DAC 216 (i.e., the output of the quantizer 214), and ideally produces the same output—only in digital form.

The operation of the sigma-delta loop ensures that the output of the DAC 216 precisely equals the level represented by the digital input signal, regardless of DAC errors. As with the topology of FIG. 1, the sigma-delta loop drives the feedback signal to a value that precisely equals, over time, the digital input signal. Because the feedback signal matches the output of the DAC 216, however, the loop also drives the output of the DAC to precisely the value represented by the digital input signal, making the output of the DAC substantially error free.

Although the DAC model 222 can correct for errors introduced by the DAC 216, the corrections it can achieve are limited by the bandwidth of the sigma-delta loop. For frequencies outside the loop bandwidth, the sigma-delta loop lacks sufficient gain to correct for errors in the feedback signal, and thus in the output of the DAC 216.

The anti-DAC model 218 and the summer 220 have been introduced to the circuit of FIG. 2 to correct for DAC errors at frequencies higher than the loop bandwidth. As shown in FIG. 2, the anti-DAC model 218 injects a feed-forward signal directly to the input of the quantizer 214. The output of the anti-DAC model is equal to the digital input signal, but deliberately distorted to oppose expected errors of the DAC 216. For example, if the DAC 216 is known to produce an output level that is slightly too high in response to a particular digital input, then the anti-DAC model is arranged to produce an output that is slightly too low. The lowered value slightly reduces the quantized input to the DAC 216, and causes the DAC to produce an output with substantially reduced error.

Except for the DAC 216 and low-pass filter 224, the entire circuit 200 is preferably implemented within a single Field-Programmable Gate Array (FPGA). Alternatively, the entire circuit 200, including the DAC and low-pass filter, could be implemented within a single Application-Specific. Integrated Circuit (ASIC).

DAC Model

Figure 3:
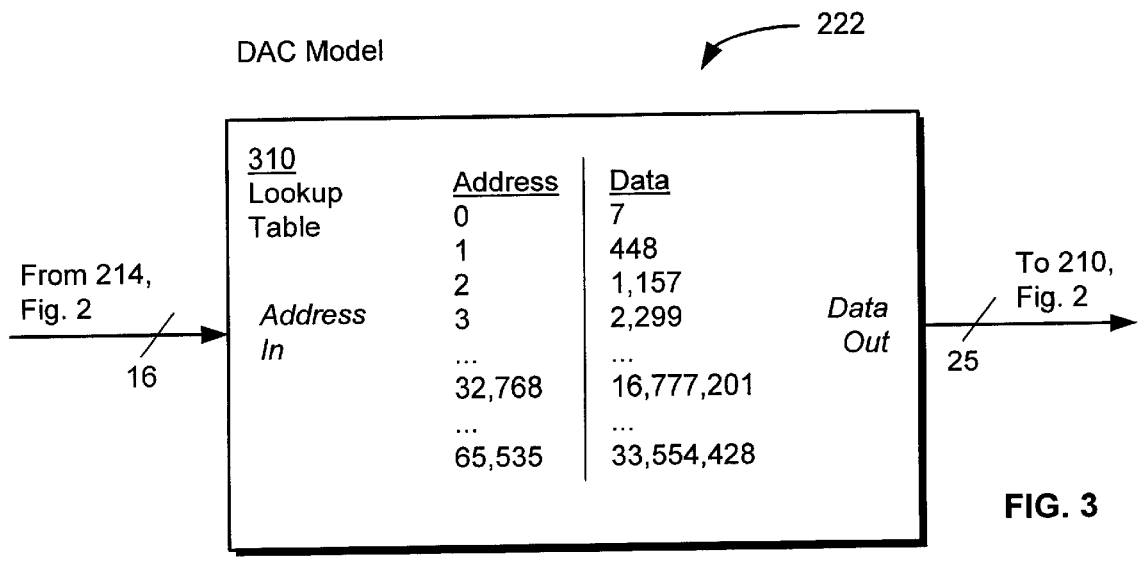
FIG. 3 is a schematic illustration of a DAC model that can be used in accordance with the circuit of FIG. 2.

FIG. 3 illustrates in schematic form an example of a DAC model 220 suitable for use with the sigma-delta DAC circuit 200. In the example shown in FIG. 3, the DAC model 220 consists of a simple lookup table 310. The lookup table 310 preferably has a different address for each input code of the DAC 216. For example, assuming that the DAC 216 has 16 bits of resolution, the lookup table 310 preferably has addresses that range from 0 to 65,535 (i.e., $2^{16}-1$). For each input code of the DAC 216, the lookup table 310 preferably stores a value that corresponds to the expected output of the DAC 216 in response to that input code.

Owing to various DAC errors, the DAC 216 generally produces output levels that are not uniformly distributed. The output levels typically vary from their ideal spacing of 1 LSB (least significant bit) by fractions of an LSB, and sometimes by more than 1 LSB. To accurately emulate the behavior of the DAC 116, the DAC model 222 preferably provides output values having resolution far greater than the resolution of the DAC itself. In the preferred embodiment, the values stored in the DAC model have a resolution of 25 bits, to accurately resolve a 16-bit DAC LSB.

The values stored in the DAC model preferably range from 0 to $2^{25}-1$ (33,554,431) and correspond to 16-bit DAC codes ranging from 0 to $2^{16}-1$ (65,535). These 25-bit values can be regarded as comprising a 16-bit part that covers the same range as the DAC codes, plus a 9-bit fractional part, which represents the resolution that the DAC model applies to each LSB of the DAC 216.

Because errors in the DAC output can be either positive or negative, a small additional range (not shown) beyond the 25-bit range is preferably provided that allows the DAC model to produce values slightly less than zero and slightly greater than full scale. Alternatively, part of the 25-bit range of the DAC model can be dedicated to representing negative numbers, and the uppermost portion of the DAC's range can be cut back.

The DAC model is not limited to being a simple lookup table. For example, the DAC model can be equipped with processing capability for computing emulated values based upon a mathematical model of the DAC 216. The DAC model can also be equipped with additional memory for storing previous states of the DAC. By accounting for both current states and previous states, the DAC model can predict and emulate transient errors of the DAC 216.

Data stored in the DAC model is preferably derived from the particular DAC 216 that the circuit 200 employs. Preferably, a calibration routine is executed at run-time, and behavioral information about the DAC is automatically measured and stored in the DAC model 220. The calibration routine is preferably executed on a regular basis, or on demand, to ensure high accuracy in spite of drift in the characteristics of the DAC over time and temperature. Alternatively, behavioral information can be extracted from the DAC 216 during a one-time characterization and permanently stored in a non-volatile memory accessible to the DAC model.

We have recognized that the behavior of the DAC 216 is highly dependent upon the rate at which the DAC is sampled. Therefore, the DAC 216 is preferably operated at a fixed sampling rate, and the calibration routine is preferably executed at this fixed sampling rate. If a user wishes to program the circuit 200 using a variable sample rate, a conventional sample rate converter is preferably included to convert the variable sample rate to a fixed sample rate prior to application to the sigma-delta DAC circuit 200.

Anti-DAC model

Figure 4:
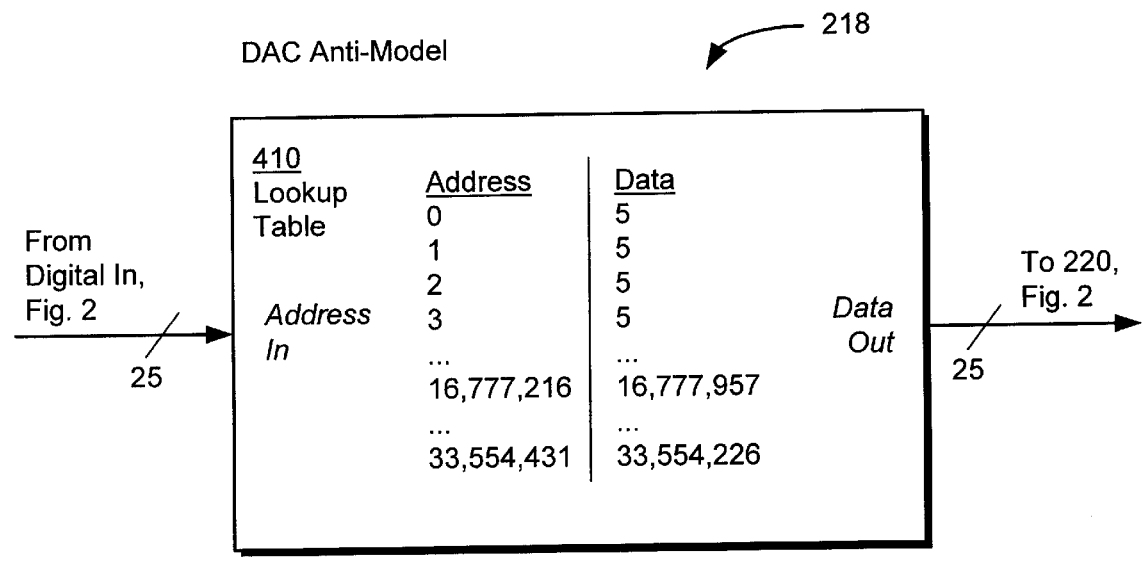
FIG. 4 is a schematic illustration of an anti-DAC model that can be used in accordance with the circuit of FIG. 2.

FIG. 4 illustrates an example of an anti-DAC model 218 that is suitable for use with the sigma-delta DAC circuit 200. Like the DAC model 222, the anti-DAC model shown in FIG. 4 consists of a simple lookup table 410. The lookup table 410 has a range of addresses that corresponds to the range of the digital input signal "Digital In." For example, the anti-DAC model 218 preferably provides $2^{25}$ different addresses, one for each possible value of the digital input signal, which is preferably 25 bits.

For each address, the anti-DAC model 218 stores a value that approximately equals the digital input signal, but is distorted to account for errors in the DAC 216. For example, if the DAC 216 is expected to produce a slightly low output signal, then the anti-DAC model would provide a slightly elevated value. The DAC 216 then responds to the slightly elevated value to produce an output signal that is corrected for the DAC's error to this input.

Like the DAC model 222, the anti-DAC model 218 can be arbitrarily complex, to account for a wide range of DAC behavior, both static and dynamic. Consequently, the anti-DAC should not be regarded as being limited to a simple lookup table. For example, the anti-DAC model can be equipped with processing capabilities to provide on-the-fly calculations. These calculations can be used to distort the output of the anti-DAC model based upon mathematical functions that describe the behavior of the DAC 216. In addition, the anti-DAC model can be equipped with additional memory to account for previous states of the DAC 216, and therefore to provide corrections for expected transient errors.

Behavioral information for the anti-DAC model 218 is preferably acquired at run-time using an automatic calibration routine that measures behavioral characteristics of the actual DAC 216 to be used, and stores those characteristics in a memory. Alternatively, the behavioral information can be extracted from the DAC 216 during a one-time characterization and permanently stored in a non-volatile memory accessible to the anti-DAC model.

Quantizer

Figure 5:
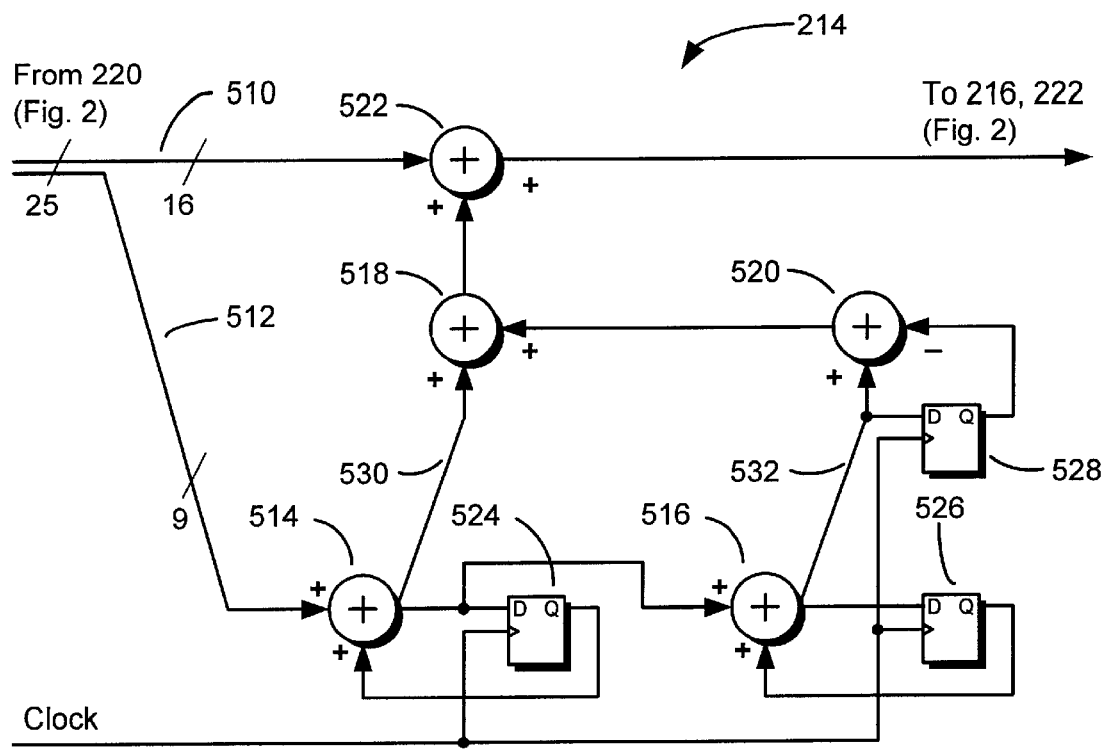
FIG. 5 is a block diagram of a noise-shaping requantizer that is suitable for use with the circuit of FIG. 2.

FIG. 5 illustrates an example of a quantizer 214 that is suitable for use with the sigma-delta DAC circuit of FIG. 2. In contrast with the simple truncating quantizer 114 of FIG. 1, the quantizer of FIG. 5 is preferably a noise-shaping requantizer or "noise shaper."

As is known, noise shapers are used to convert relatively high resolution digital signals to relatively low resolution digital signals without sacrificing signal fidelity. Through noise shaping, truncation errors are stored, and then added to or subtracted from subsequent samples. The net effect is to redistribute the noise spectrum of a requantized signal from a relatively flat characteristic to one that has greatly decreased noise at the frequencies of interest and increased noise at higher frequencies. The higher frequency noise can generally be filtered, leaving signals with much lower total noise than can be provided without noise shaping.

Noise shaping the input to the DAC 216 allows the circuit 200 to benefit from the high resolution of the values from the anti-DAC model 218. Because the noise shaper 214 effectively increases resolution by spreading quantization errors over many samples, the noise shaper allows the higher resolution bits from the anti-DAC model 218 to impact the output of the DAC 216. The noise shaper thus improves the accuracy of the circuit 200 by ensuring that high-resolution corrections from the anti-DAC model 218 are not simply truncated away.

Noise shapers are well known, and the particular form of the noise-shaper is not critical to the invention. We have found, however, that a second order noise shaper such as the one shown in FIG. 5 provides adequate performance without adding significant complexity. Higher order noise shapers can be used with improved performance, but with commensurate increases in complexity.

Although the noise-shaping requantizer improves the performance of the circuit 200, it is not strictly essential to the invention, as it only affects performance of the circuit 200 for frequencies outside the bandwidth of the sigma-delta loop.

Loop Filter

Figure 6:
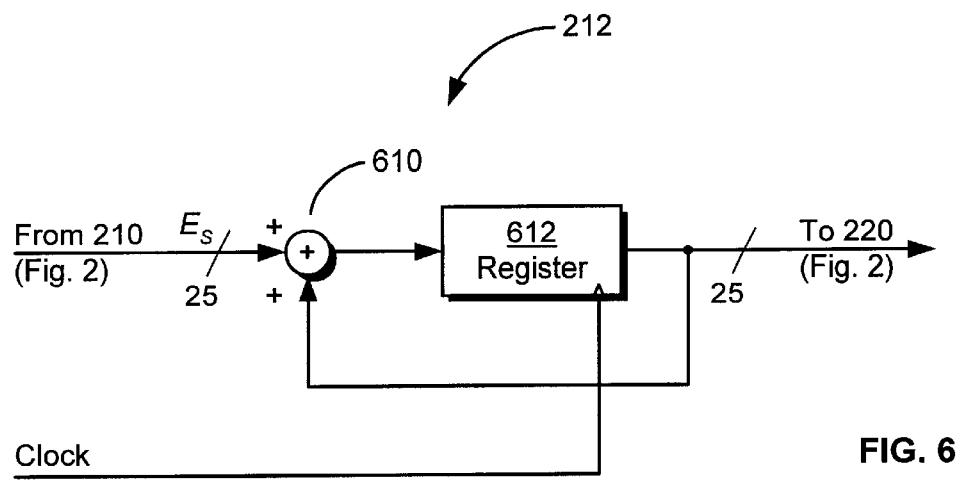
FIG. 6 is block diagram of a loop filter that is suitable for use in the circuit of FIG. 2.

FIG. 6 illustrates an example of a loop filter 212 that is suitable for use with the sigma-delta DAC circuit of FIG. 2. Within the loop filter 212, the error signal $E_S$ is provided to an input of a summer 610. The error signal is added, via the summer 610, to an accumulated signal from the output of a register 612. Upon each active edge of a sampling clock, the register 612 is updated to reflect the accumulated sum of the register's previous contents and the current value of the error signal. Because the feedback of the sigma-delta loop tends to drive the error signal to zero, the output of the register 612 tends to zero-in on a stable value. By accumulating the error signal upon each edge of the sample clock, the loop filter 212 behaves in a manner analogous to an analog integrator, which integrates the error signal over time.

Advantages

From the foregoing description, it is apparent that the sigma-delta DAC circuit 200 according to the invention can achieve significantly greater accuracy than the conventional topology of FIG. 1. Because DAC errors are effectively compensated, relatively inexpensive DACs can be used provide accurate performance over a wide frequency range. A single topology can be used to cover a broad range of frequencies, where multiple topologies were previously required. The current invention thus reduces the cost of ATE systems and takes up less space than prior techniques.

Alternatives

In addition to the preferred embodiment and the variations described above, other embodiments and variations can be made.

For example, the loop filter 212 has been described above as a simple digital accumulator. However, this is merely an example. Multiple accumulators can be cascaded to effectively effect multiple integrations upon the error signal. Other adjustments can be made to the loop filter 212 to enhance stability and loop performance.

As described above, the sigma-delta DAC circuit 200 is preferably operated at a fixed sampling rate. Alternatively, the circuit 200 can be provided with a selection of different sampling rates, and different information can be stored in the DAC model 222 and anti-DAC model 218 to provide accurate corrections for DAC behavior at each of the different sampling rates. As yet another alternative, the DAC 216 can be operated at variable sampling rates, with one set of behavioral information that provides adequate, though non-optimal, performance at different sampling rates.

The sigma-delta DAC circuit 200 is described above as including both a DAC model 222 and an anti-DAC model 218, wherein the anti-DAC model 218 provides corrections outside the bandwidth of the sigma-delta loop. If corrections outside the bandwidth of the loop are not required, the anti-DAC model 218 can be eliminated, and the noise-shaping requantizer 214 can be replaced with a simple truncating quantizer. We have also found that the contribution of the anti-DAC model 218 is less significant as pipeline delays through the circuit 200 are reduced. For example, if the number of pipeline delays in the circuit 200 were reduced to zero, the DAC model 222 would correct for all DAC errors as they were produced. The anti-DAC model 218 could thus be eliminated, and the noise shaper could be replaced with a simple quantizer.

In addition, the specific structures illustrated in the figures and described above are intended to show actions performed on signals and signal flow at a conceptual level. The actual hardware implementation may differ substantially from the structure indicated, in accordance with conventional rules and practices for implementing digital circuits.

Each of these alternatives and variations, as well as others, has been contemplated by the inventor and is intended to fall within the scope of the instant invention. It should be understood, therefore, that the foregoing description is by way of example, and that the invention should be limited only by the spirit and scope of the appended claims.

What is claimed is:

1. A circuit for generating an analog output signal from a digital input signal that represents the analog output signal, comprising:
   a loop filter having an output conveying a filtered signal that varies in response to a difference between the digital input signal and a feedback signal;
   a DAC having a input coupled to the output of the loop filter and generating an analog output signal; and
   a DAC model storing a plurality of behavioral information about the DAC, the DAC model having an input coupled to the output of the loop filter, generating the feedback signal responsive to the plurality of behavioral information, and emulating the analog output signal.

2. The circuit as recited in claim 1, further comprising:
   a quantizer coupled between the output of the loop filter and the inputs of the DAC and the DAC model.

3. The circuit as recited in claim 2, wherein the quantizer is a noise-shaping requantizer.

4. The circuit as recited in claim 3, further comprising:
   an anti-DAC model having an input that receives the digital input signal and an output that provides a signal that is distorted to compensate for a plurality of errors of the DAC; and
   a summer that provides a sum of the output of the anti-DAC model and the output of the loop filter to the input of the quantizer.

5. The circuit as recited in claim 4, wherein the anti-DAC model stores digital values that affect the analog output signal in opposition to the plurality of errors of the DAC, to effectively cancel the plurality of errors of the DAC.

6. The circuit as recited in claim 3, wherein the noise-shaping requantizer has an order of two.

7. The circuit as recited in claim 1, wherein the feedback signal comprises digital values having a resolution greater than a resolution of the DAC.

8. The circuit as recited in claim 7, wherein the plurality of behavioral information stored in the DAC model accounts for linearity errors of the DAC.

9. The circuit as recited in claim 7, wherein the plurality of behavioral information stored in the DAC model accounts for transient errors of the DAC.

10. The circuit as recited in claim 7 wherein the plurality of behavioral information stored in the DAC model accounts for at least one previous state of the DAC.

11. The circuit as recited in claim 1, implemented with digital circuitry.

12. The circuit as recited in claim 11, wherein the digital circuitry is implemented within at least one FPGA.

13. The circuit as recited in claim 1, wherein the loop filter includes at least one digital accumulator for varying the filtered signal in proportion to an accumulated sum of the difference between the digital input signal and feedback signal.

14. The circuit as recited in claim 1, further comprising a low-pass filter coupled to the output of the DAC.

15. A method of generating an analog output signal from a digital input signal representing the analog output signal, comprising:
   generating a filtered signal responsive to a difference between the digital input signal and a feedback signal;
   quantizing the filtered signal;
   converting the quantized signal into the analog output signal; and
   modeling the converting step to generate the feedback signal, including varying the feedback signal to account for errors introduced by the converting step.

16. The method as recited in claim 15, wherein the quantized signal has a resolution lower than a resolution of the digital input signal.

17. The method as recited in claim 16, wherein the step of quantizing includes noise-shaping the filtered signal.

18. The method as recited in claim 17, further comprising:
   generating a distorted version of the digital input signal,
   wherein the quantizing step operates upon a sum of the filtered signal and the distorted version of the digital input signal.

19. The method as recited in claim 18, wherein the step of generating the distorted digital input signal includes applying behavioral information about the converting step to correct for errors in the converting step.

20. The method as recited in claim 16, wherein the feedback signal has a resolution that is greater than the resolution of the quantized signal.

21. The method as recited in claim 15, wherein the step of modeling includes applying stored behavioral information about the converting step to model the converting step.

22. The method as recited in claim 21, wherein the behavioral information includes information concerning the linearity of the converting step.

23. The method as recited in claim 21, wherein the behavioral information includes information concerning transient behavior of the converting step.

24. The method as recited in claim 21, wherein the behavioral information includes information concerning previous levels produced by the converting step.

25. The method as recited in claim 15, wherein the generating step includes a step of accumulating a sum of the difference between the digital input signal and the feedback signal taken at different instances in time.

26. The method as recited in claim 15, further comprising low-pass filtering the analog output signal.

* * * * *